US010847234B2

(12) United States Patent
Zhao et al.

(10) Patent No.: US 10,847,234 B2
(45) Date of Patent: Nov. 24, 2020

(54) PROGRAM VERIFY TECHNIQUE FOR NON-VOLATILE MEMORY

(71) Applicant: Intel Corporation, Santa Clara, CA (US)

(72) Inventors: Han Zhao, Santa Clara, CA (US); Richard Fastow, Cupertino, CA (US); Krishna K. Parat, Palo Alto, CA (US); Arun Thathachary, Santa Clara, CA (US); Narayanan Ramanan, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/396,478

(22) Filed: Apr. 26, 2019

(65) Prior Publication Data
US 2020/0342946 A1 Oct. 29, 2020

(51) Int. Cl.
G11C 16/34 (2006.01)
G11C 16/04 (2006.01)
G11C 16/08 (2006.01)
G11C 16/26 (2006.01)
G11C 11/56 (2006.01)

(52) U.S. Cl.
CPC ...... *G11C 16/3459* (2013.01); *G11C 16/0483* (2013.01); *G11C 16/08* (2013.01); *G11C 16/3427* (2013.01); *G11C 11/5628* (2013.01); *G11C 11/5671* (2013.01); *G11C 16/26* (2013.01)

(58) Field of Classification Search
CPC ... G11C 16/3459; G11C 16/043; G11C 16/08; G11C 16/3427
See application file for complete search history.

(56) References Cited

U.S. PATENT DOCUMENTS

| | | | | |
|---|---|---|---|---|
| 7,408,811 B2* | 8/2008 | Shirota | ............ | G11C 16/0483 365/176 |
| 10,262,703 B2* | 4/2019 | Shimura | ............ | G11C 7/1051 |
| 2006/0245251 A1* | 11/2006 | Shirota | ............ | G11C 16/0483 365/185.17 |
| 2014/0241069 A1* | 8/2014 | Kwak | ............ | G11C 16/26 365/185.22 |
| 2018/0261267 A1* | 9/2018 | Shimura | ............ | G11C 7/1051 |
| 2019/0043594 A1 | 2/2019 | Zhao et al. | | |

* cited by examiner

Primary Examiner — Tri M Hoang
(74) Attorney, Agent, or Firm — Compass IP Law, PC

(57) ABSTRACT

A technique for read or program verify (PV) operations for non-volatile memory is described. In one example, at the end of a program verify operation (e.g., during a program verify recovery phase), a number of wordlines near a selected wordline are ramped down one at a time. Ramping down wordlines near the selected wordline one at a time can significantly reduce the trapped charge in the channel, enabling lower program disturb rates and improved threshold voltage distributions. In one example, the same technique of ramping down wordlines near the selected wordline can be applied to a read operation.

20 Claims, 5 Drawing Sheets

600

APPLY VOLTAGES TO WORDLINES TO PERFORM A PROGRAM VERIFY OR READ OPERATION
602

RAMP DOWN THE VOLTAGES APPLIED TO A NUMBER OF THE WORDLINES NEAR THE SELECTED WORDLINE ONE AT A TIME
604

PROGRAM VERIFY TECHNIQUE FOR NON-VOLATILE MEMORY

FIELD

The descriptions are generally related to non-volatile storage media such as NAND flash memory.

BACKGROUND

Flash storage, such as NAND flash memory, is a nonvolatile storage medium. Nonvolatile storage refers to storage having a state that is determinate even if power is interrupted to the device. Three dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low error rate, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

A program verify technique for non-volatile memory is described herein.

In conventional 3D NAND devices, at the end of a program verify operation, the voltages applied to all the wordlines are ramped down at the same time. Shutting down all the wordlines at once can lead to some undesirable consequences such as electrons trapped in the channel. Electrons trapped in the channel can lead to unwanted hot electron injection in subsequent program operations, which adversely impacts die operation. For example, unwanted electron injection can lead to program disturb, which can lead to overlap in the threshold voltage distributions of different levels.

In contrast, in one example, a number of wordlines near a selected wordline are ramped down one at a time. Ramping down wordlines near the selected wordline one at a time can significantly reduce the trapped charge in the channel, enabling lower program disturb rates and improved threshold voltage distributions. In one example, the same technique of ramping down wordlines near the selected wordline can be applied to a read operation.

Figure 1:
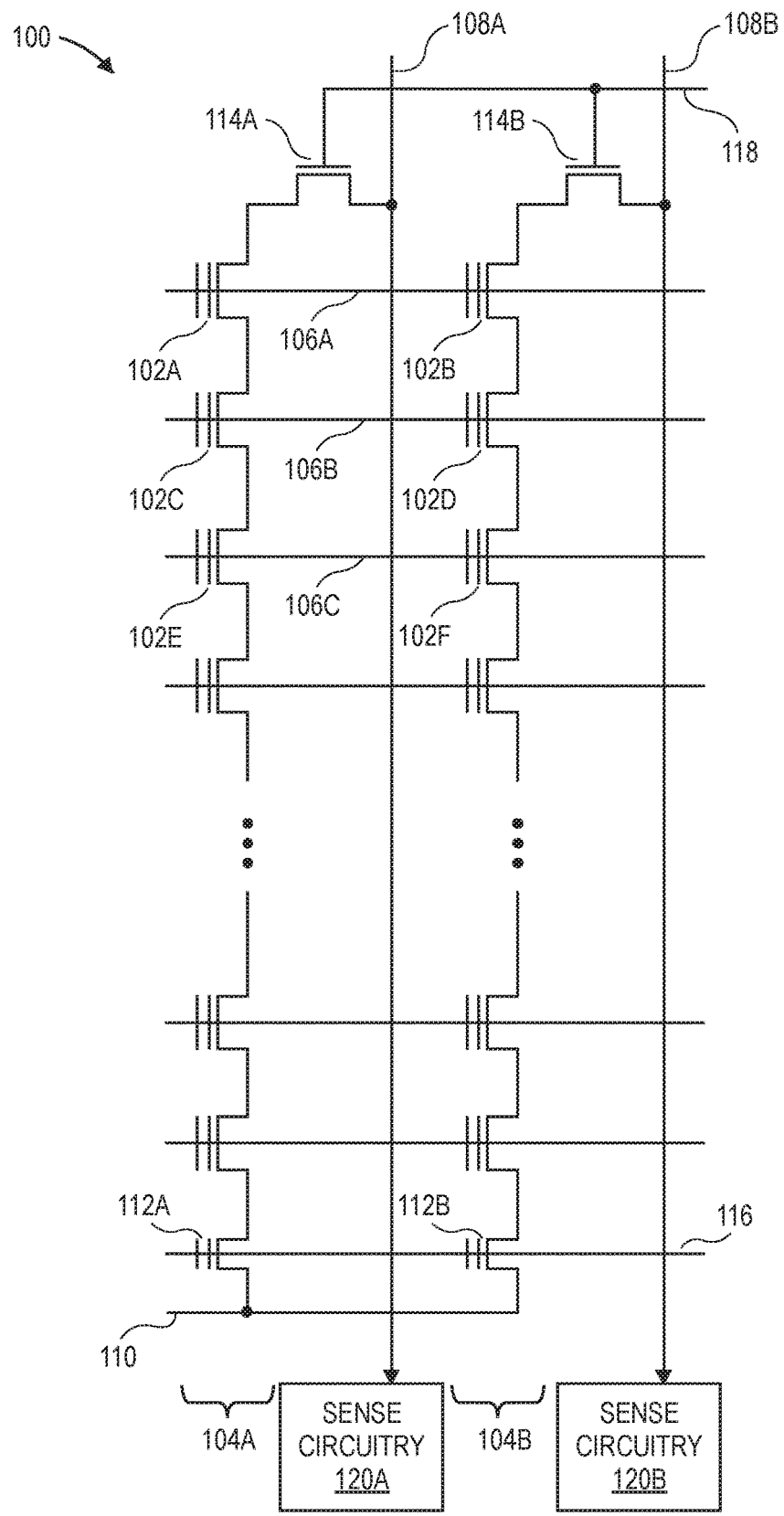
FIG. 1 depicts an example portion of a NAND flash memory array in which program verify techniques can be implemented.

FIG. 1 depicts an example portion of a NAND flash memory array 100 in which wordline-by-wordline ramping down for program verify can be implemented. The NAND flash memory array 100 includes multiple non-volatile memory cells 102A-102F (abbreviated as 102) arranged in columns, such as series strings 104A and 104B (abbreviated as 104). In one example, the memory cell 102 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 102 can include a transistor with a floating gate (e.g., a high resistance poly gate) that stores charge indicative of one or more bit values. Other architectures are also possible. In the series strings 104, drain regions of cells 102 are (with the exception of the top cell) coupled to a source region of another cell 102.

The array 100 also includes wordlines 106A-106C. The wordlines 106A-106C can span across multiple series strings 104 (e.g., a wordline may be coupled to one memory cell of each series string 104) and are connected to the control gates of each memory cell 102 of a row of the array 100 and used to bias the control gates of the memory cells 102 in the row. The bitlines 108A and 108B (abbreviated as 108) are each coupled to a series string 104 by a drain select gate 114 and sensing circuitry 120A and 120B that detects the state of each cell by sensing voltage or current on a particular bitline 108.

Multiple series strings 104 of the memory cells are coupled to a source line 110 by a source select gate 112A and 112B (abbreviated as 112) and to an individual bitline 108 by a drain select gate 114A and 114B (abbreviated as 114). The source select gates 112 are controlled by a source select gate control line 116 and the drain select gates 114 are controlled by a drain select gate control line 118.

Figure 2:
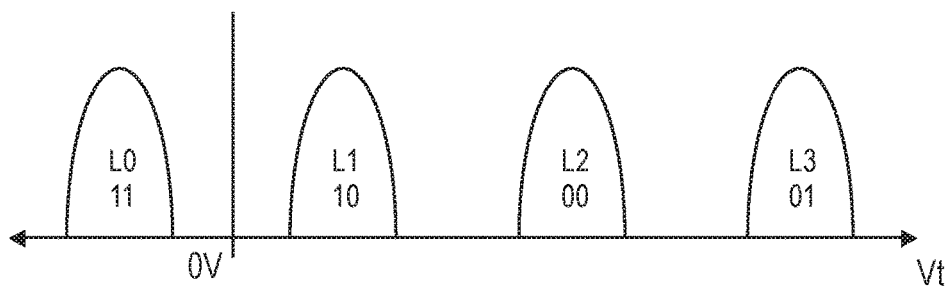
FIG. 2 illustrates an example of threshold voltage distributions for a NAND flash cell.

In some examples, each memory cell 102 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. For example, FIG. 2 illustrates an example of threshold voltage distributions for a cell with four levels or states. Level 0 (L0) corresponds to an erase state of 11, level 1 (L1) corresponds to a first program level of 10, Level 2 (L2) corresponds to a second program level of 00, and Level 3 (L3) correspond to a program level of 01. Thus, the example in FIG. 2 is for a multi-level cell that can store 2 bits of data.

In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a wordline (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 3:
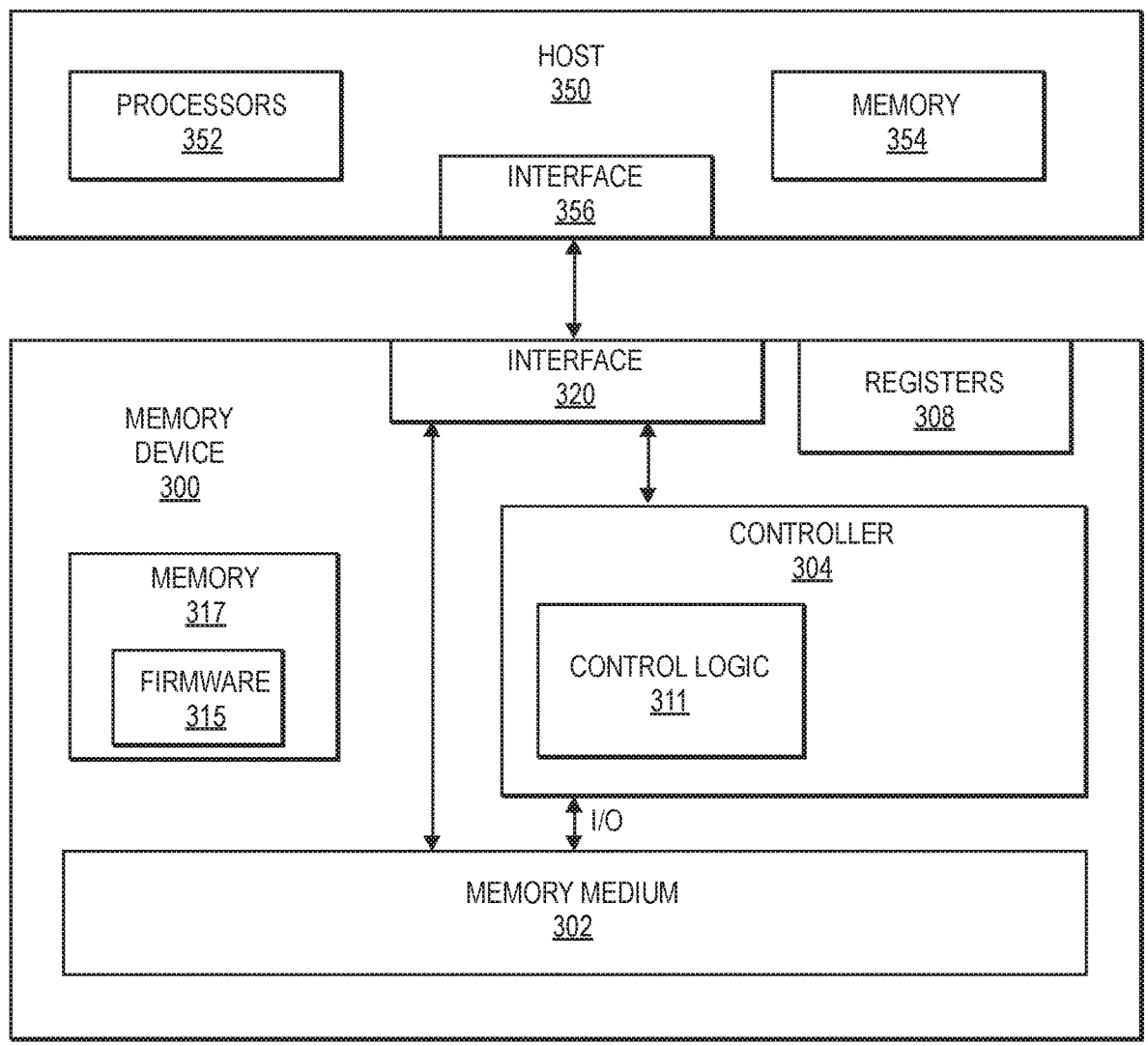
FIG. 3 depicts an example system.

FIG. 3 depicts an example system. The system includes a host 350 and a non-volatile storage or memory device 300. The host 350 and memory device 300 can be an example of a system that exists within the confines of a computer's package (e.g., within a laptop/notebook, server, or other computer). In other examples, the memory device 300 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 350 includes one or more processors 352, memory 354, and other components that are omitted from the drawing for clarity.

The memory device includes a memory medium 302 for storing data. Memory medium 302 can be a memory or storage medium that can store one or more bits in memory cells. In one example, the memory medium 302 includes a storage array that includes strings of memory cells such as the NAND string illustrated in FIG. 1. The memory medium 302 can include non-volatile and/or volatile types of memory. In one example, the memory medium 302 includes one or more non-volatile memory die, each divided into multiple planes or groups. In some examples, the memory medium 302 can include block addressable memory devices, such as NAND technologies. In one example, the memory medium 302 includes a NAND flash memory array such as the array in FIG. 1. The memory medium 302 can also include non-volatile types of memory, such as 3D crosspoint memory (3DxP), or other byte addressable non-volatile memory. Other technologies, such as some NOR flash memory, may be byte addressable for reads and/or writes, and block addressable for erases. The memory medium 302 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 302 can include a single-level cell (SLC) NAND storage device, a multi-level cell (MLC) NAND storage device, triple-level cell (TLC) NAND storage device, quad-level cell (QLC) storage device.

According to some examples, volatile types of memory included in the memory medium 302 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The memory device 300 can communicate with a host system 350 using respective interfaces 320 and 356. In one example, the interface 356 is a part of a peripheral control hub (PCH). In the illustrated example, the controller 304 is coupled with a computing platform such as host 350 using the interface 320. In one example, the controller 304 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 304 can communicate with elements of the computing platform to read data from memory medium 302 or write data to memory medium 302. Although in this disclosure, the term "host" is referring to a system with a processor (or other device sending requests to access data stored in a non-volatile memory) and an interface for communicating with the NAND (e.g., the host 350), some implementations may refer to the controller 304 as a "host" relative to the non-volatile memory medium 302.

The controller 304 can be configured to receive requests from the host 350 and generate and perform commands concerning the use of memory medium 302 (e.g., to read data, write, or erase data). Other commands may include, for example, commands to read status, commands to change configuration settings, a reset command, etc. The controller can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The memory device typically also includes memory 317 coupled to the logic circuitry 311 which can be used to cache data from the non-volatile media and store firmware 315 executed by the controller 304. The term "control logic" can be used to refer to both logic circuitry, firmware, software, or a combination. For example, control logic can refer to the control logic 311, firmware 315, or both.

The controller 304 is coupled with the memory medium 302 to control or command the memory to cause operations to occur (e.g., read, program, erase, suspend, resume, and other operations). Communication between the memory medium 302 and the controller 304 may include the writing to and/or reading from specific registers (e.g., registers 308). Such registers may reside in the controller 304, in the memory medium 302, or external to the controller 304 and the memory medium 302. Registers or memory within the memory medium 302 may be reachable by the controller 304 by, e.g., an internal interface of the memory device 300 that exists between the controller 304 and memory medium 302 (e.g., an Open NAND Flash Interface (ONFI) interface, a proprietary interface, or other interface) to communicatively couple the controller 304 and memory medium 302. Input/output (I/O) pins and signal lines communicatively couple the controller 304 with the memory medium 302 to enable the transmission of read and write data between the controller 304 and the memory medium 302. The I/O pins may also be used to transmit other data, such as status information of the dies or planes of memory medium 302. The memory medium 302 can also include other pins such as command pins (e.g., command latch enable (CLE), address latch enable (ALE), chip enable (CE #), read enable (RE #), and write enable (WE #)), power and ground pins (e.g., Vcc, Vss, etc.).

The controller 304 can be coupled to word lines of memory medium 302 to select one of the word lines, apply read voltages, apply program voltages combined with bit line potential levels, apply verify voltages, or apply erase voltages. The controller 304 can be coupled to bit lines of memory medium 302 to read data stored in the memory cells, determine a state of the memory cells during a program operation, and control potential levels of the bit lines to promote or inhibit programming and erasing.

The memory medium 302 can include a NAND memory. Typical NAND dies have multiple planes per die. A plane includes multiple memory cells which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512B, 2 kB, 4 kB, etc.).

Figure 4A:
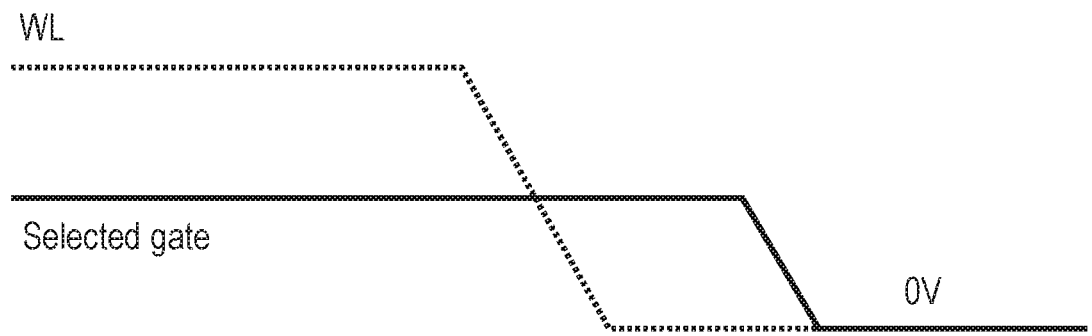
FIG. 4A illustrates an example waveform in which the voltage for all wordlines is ramped down at the same time.

As mentioned above, in a typical NAND device, a programming pass may include the application of one or more verify voltages (program verifies) to cells in order to determine which cells have finished programming. In a conventional NAND device, at the end of program verify (PV), all wordlines (WLs) (e.g., the voltage(s) applied to all wordlines) are ramped down at the same time. For example, FIG. 4A illustrates the wordlines voltage for all wordlines being ramped down at the same time.

Ramping the wordline voltage down for all cells at the same time can result in excessive charge in the pillar, which can lead to program disturb. For example, a typical 3D NAND has a floating body structure. As a result, the body potential can go to negative voltages if excessive electrons cannot be discharged from pillar. When this happens after a program verify operation and before the next program pulse, the channel boosting voltage can become less than desired, leading to program disturb. For example, for 3D NAND without body contacts, at the end of program verify (PV) as the WL voltage ramps down, high Vt cells will get turned off first. When the high Vt cells get turned off first, the string gets shut off, preventing the electrons of the low Vt cells present in the channel from getting discharged. During the next program pulse, these electrons which were not able to discharge from last program verify pulse will move to the program WL (WLn) and reduce the boosting voltage for the inhibited cells, thus leading to program disturb degradation.

Figure 4B:
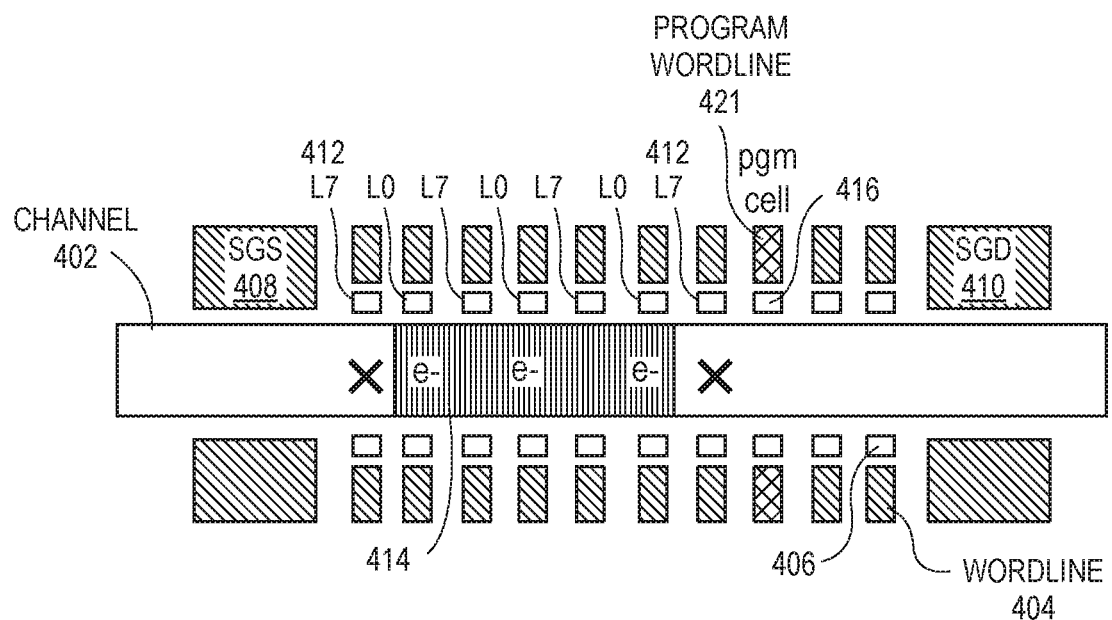
FIG. 4B illustrates an example of a cross-section of a 3D NAND string with excess charge trapped in the channel.

FIG. 4B illustrates an example of a cross-section of a 3D NAND string with excess charge trapped in the channel. In the FIG. 4B, a cross-section of a 3D NAND pillar is shown horizontally. The SGS (select gate source) 408 and SGD (select gate drain) 410 are select gates at the ends of the pillar. On either side of the channel 402 are storage elements 406 where charge is stored or programmed and wordlines 404. The elements 406 can be floating gates, charge traps, or other storage elements.

During various array operations, the wordlines 404 are charged and discharged. FIG. 4B illustrates an example in which the cell 416 is programmed and verified. As mentioned above, programming a cell may include the application of one or more program voltage pulses to cells to be programmed followed by the application of one or more verify voltage pulses. Thus, a program voltage pulse is applied to the program wordline 421 to program the cell, followed by a verify pulse to verify the level of the cell. In one example, the other wordlines that are not being programmed are inhibited during the program and verify operations. Inhibiting typically involves reducing the control gate to channel voltage bias. For example, an inhibit voltage can be applied to one or more surrounding wordlines for cells that are not being programmed. The channel voltage may also be increased (e.g., boosted) for cells in a page that are not being programmed. In one example, by reducing the voltage potential across the control and floating gates, Fowler-Nordheim tunneling can be inhibited for those cells to prevent electron injection into the floating gate. Although the voltages applied to the wordlines during program and verify operations may vary depending on implementation, typically some voltage (e.g., between 0-10V) will be applied to all the wordlines of a string during the program and verify operations.

Assume in the example illustrated in FIG. 4B, that after application of a program pulse to the program wordline 421, a program verify is performed. In one example, the program verify operation has a "program verify recovery phase" at the end of the verify operation. In the illustrated example, every wordline is taken to the same voltage (E.g., a "vpass reset" voltage) at the beginning of the verify recovery phase after verify is completed. After the verify recovery phase, the wordlines are discharged. Although in the illustrated example, all the wordlines are shown as being brought to the same voltage in the verify recovery phase, in another example, wordlines may not all be taken to the same voltage level. One or more wordlines of a string could be taken to different voltage levels at the end of the program verify operation. The range of voltages that the WLs might be sitting at during the program verify can be anywhere b/w 0 to 10 V, depending on implementation. Regardless of the voltage level that the wordlines are charged to during program verify, after the verify operation, the wordlines 421 and 404 are discharged. As mentioned with respect to FIG. 4A, conventional NAND devices discharge all the wordlines at the same time.

When discharging the wordlines, the memory cells get electrically "cut off" from the source 408 and drain 410. The time at which a given cell gets cut off depends on the threshold voltage (Vt) of the cell. The threshold voltage of the cell depends on what level the cell has been programmed to. Memory cells programmed to higher levels have a high Vt and get turned off before cells programmed to a lower level that have a lower Vt. Thus, the high Vt cells in the NAND string will turn off first, which can cut off the string electrically from the source and drain. Once this happens, the electrons in some low Vt cells cannot be discharged.

Referring to FIG. 4B, some cells are programmed to L7 (level 7 for TLC cells) and some are programmed to L0 (level 0). In the example illustrated in FIG. 4B, some L0 cells are located between L7 cells (cells 412) on the string. When the cells 412 turn off, electrons from the cells between the cells 412 can become trapped in a region 414 of the channel 402. The X's on the channel 402 indicate that the L7 cells have cut off the channel on either side, trapping electrons in the region 414. This is similarly applicable to cells with fewer or more levels. For example, QLC cells can be anywhere between level 0 (L0) to level 15 (L15). In one such example, the higher level cells (e.g., L15 cells) turn off first, potentially cutting off other cells from the channel and trapping electrons in the channel.

The trapped charge carriers left in the channel 402 can cause issues in subsequent array operations. For example, these electrons trapped in the channel can move to the neighboring Vpgm WL during the next program (pgm) pulse and degrade the boosting window. Degraded boosting window can cause program disturb. Program disturb refers to the inadvertent programming of a memory cell. In one example, program disturb results in the mis-programming of a memory cell level with Fowler-Nordheim tunneling due to an over-abundance of electrons in the channel of a memory cell being programmed or inhibited.

Figure 5A:
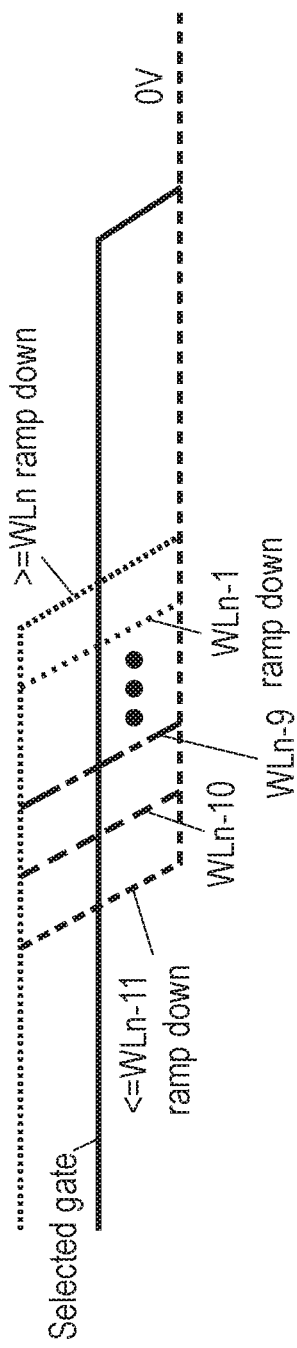
FIG. 5A illustrates an example of a waveform in which the wordlines are ramped down one by one.
Figure 5B:
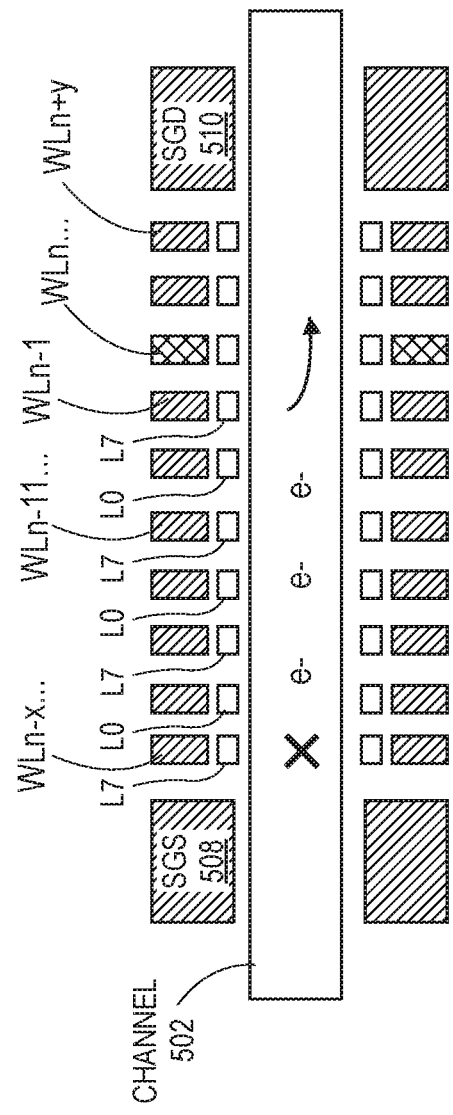
FIG. 5B illustrates a cross-section of a 3D NAND string in which the wordlines are ramped down one at a time.

Instead of ramping down all the wordlines together, ramping down the wordlines one by one at the end of the program verify can reduce program disturb. FIG. 5A illustrates one example of a waveform in which the wordlines are ramped down one by one. FIG. 5B illustrates a cross-section of a 3D NAND string in which the wordlines are ramped down one at a time.

In the example illustrated in FIGS. 5A and 5B, two or more wordlines are ramped down one at a time and sequentially in a direction from at least one end of the string to the program wordline. The program wordline is labeled WLn. The program wordline may also be referred to as a target wordline or a selected wordline. There are x wordlines below and y wordlines above the program wordline WLn. In one example, a pre-defined number of wordlines prior to the program wordline WLn are ramped down one by one. In the illustrated example, the wordlines "prior to" or "below" the program wordline are the wordlines on the side of the string closer to the selecting gate 508 at the source side. In the example illustrated in FIG. 5A, the first wordline to be discharged is WLn−11, which is 11 wordlines below the active wordline WLn. After WLn−11 is ramped down, WLn−10 is ramped down, and so forth until WLn−1 is ramped down. In one example, after WLn−1 is ramped down, the selected wordline WLn is ramped down. In the illustrated example, WLn and any wordlines above WLn are ramped down at the same time. In this example, wordlines that are "above" or "after" the program wordline are wordlines on the side of the string closer to the selecting gate at the drain 510.

In one example, the pre-defined number of wordlines near the program wordline are ramped down one by one with some time delay (e.g., ~0.1-0.5 μS) between each ramp down. A shorter delay between the ramp-down of adjacent wordlines can enable shorter total verify time, but may result in some electrons not discharging. In one such example, the delay is set such that there is overlap in the ramp-down of adjacent wordlines. For example, while one wordline is still ramping down (before that wordline has reached its final ramp-down voltage), the next wordline starts to ramp down. A longer delay between ramp-down of adjacent wordlines can enable electrons to fully discharge at the end of the program verify, but leads to a greater program time penalty. In one such example, a wordline starts to ramp down after the previous wordline has reached its final ramp-down voltage (e.g., 0V). In one example, the time delay between ramping down two adjacent wordlines can be adjusted with a mode register. Adding a time delay between the ramp down of each wordline can enable the excessive electrons near WLn time to discharge at end of program verify.

When discharging WLn, the wordlines before WLn (e.g., wordlines <=WLn−1) would have already been ramped down and would cut off the electron discharge path to the selecting gate at source side (as illustrated by the X in the channel 502). However, the wordlines above WLn (e.g., wordlines >=WLn+1) would still be at high voltage and hence there would be an electron discharge path from WLn to the selecting gate at the drain side to allow WLn electrons to discharge. As a result, there will be no excessive electrons left under the low Vt cells after program verify. Without any excessive electrons trapped in the NAND string, there will be no degradation of the boosting voltage in the next program pulse to cause program disturb.

Note that although FIG. 5A illustrates the sequence as starting with ramping down WLn−11, the sequence can begin at an earlier or later wordline. For example, the ramp-down sequence can start by ramping down wordline WLn−12, WLn−10, WLn−5, WLn−4, WLn−2, WLn−1 etc., and ramping the wordlines down one-by-one until WLn. In one example, all the wordlines on one side of the program wordline Wn are ramped down one at a time. In another example, only a number of wordlines closest to the program wordline Wn are ramped down one at a time, and the wordlines before or after it are ramped down at the same time.

Also, although the direction of ramping down the wordlines in FIG. 5A is from the source to the drain, in other implementations, a pre-defined number of wordlines after the program wordlines can be ramped-down from drain to source (e.g., first ramping down WLn+y, followed by WLn+y−1, etc.).

Additionally, in the illustrated example WLn and any remaining wordlines above it are ramped down at the same time. In another implementation, a pre-defined number of are ramped down one-by-one before and after the program wordline. For example, WLn−1 is ramped down, followed by WLn, followed by WL+1, etc.

Although there are benefits in terms of reduced program disturb when the wordlines are ramped down one-by-one, ramping all the WLs one by one can cause significant program time penalty. In one example, to reduce the program time penalty, the one WL by one WL ramping down sequence at end of program verify (VRCV or verify recovery) is applied only to WLs near the wordline being programmed (WLn). As mentioned before, FIG. 5A illustrates an example in which 11 wordlines before WLn are ramped down one at a time. In other examples, fewer or more wordlines (e.g., 2-15 wordlines up to all the wordlines) near the selected wordline may be ramped down one by one. By ramping down a pre-defined number of wordlines near the program wordline rather than all the wordlines, a similar program disturb improvement can be achieved (e.g., similar as the improvement seen when ramping down on all WLs) but with much smaller program time penalty. Even though there may be excessive electrons trapped at <=⁻WLn−11, these electrons are far enough away from WLn that they do not cause boost voltage loss during the program pulse.

The wordline-by-wordline ramp-down can apply to all levels or less than all levels. In a typical NAND device, the verify operation happens in the order in which the levels are programmed. For example, level 1 (L1) is programmed and then L1 is verified; level 2 (L2) is programmed, and then L2 is verified, and so on until the highest level cells (e.g., L7 if TLC or till L15 if QLC) are programmed. In one example, one or more mode registers are used to specify which level to start using the wordline-by-wordline ramp-down sequence. In one such example, if the mode register indicates that the sequence starts with L5, then the wordline-by-wordline ramp-down sequence is applied to L5, L6, and L7 (for TLC). If the register indicates L7, the sequence will only be applied to L7 (for TLC). In one example, the other lower levels apply the conventional sequence (e.g., all wordlines ramp down together). For example, if the mode register indicates that the sequence starts at L7 for TLC, then for levels L1-L6 the wordlines ramp down at the same time at the end of the program verify, and for the L7 program verify, at least some of the wordlines ramp down one at a time. Specific examples of levels to begin the wordline-by-wordline ramp-down sequence include: L5 or L7 for TLC and L9, L13, or L15 for QLC. While the greatest benefit may be achieved by applying the wordline-by-wordline ramp-down sequence to the upper levels, other examples may also apply the wordline-by-wordline ramp-down sequence to one or more of the lower levels or to all levels. Applying the wordline-by-wordline ramp-down for only some levels can minimize the verify time impact while still improving program disturb because most of the undesirable disturb effects happen while programming/verifying the highest levels.

Thus, this technique involves changing the sequence in which WLs are ramped down at the end of PV to discharge the excess electrons in the NAND string. The voltage applied to two or more wordlines between a selected wordline and at least one end of the string is ramped down one at a time, enabling discharge of excess charge. Discharging the excessive electrons from the pillar at end of program verify can enable mitigation of the negative body potential issue before the next program pulse, leading to improved program disturb.

Figure 6:
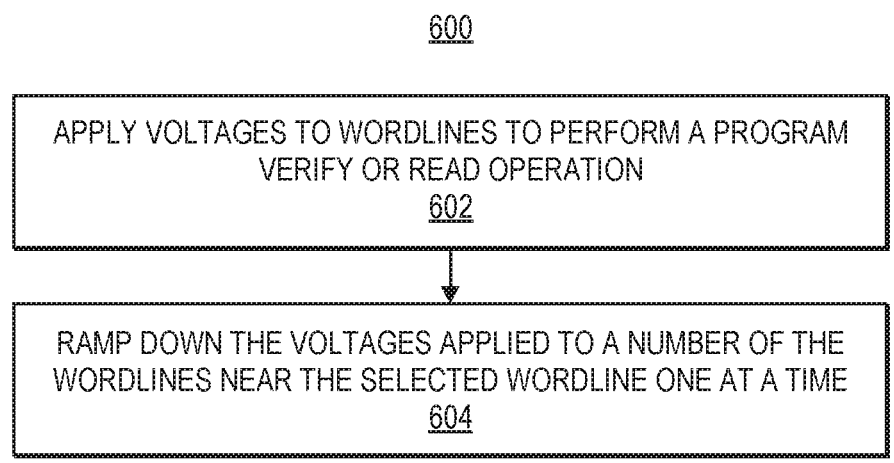
FIG. 6 is a flow chart of an example of a method of performing a verify or read operation.

FIG. 6 is a flow chart of an example of a method of performing a verify or read operation. In one example, the method 600 is performed by logic of a non-volatile memory device. In one such example, the method 600 is performed by microcode and/or circuitry on a 3D NAND die.

The method 600 begins by applying voltages to wordlines to perform a program verify or a read operation, at operation 602. In one such example, as a part of a program sequence, a program verify is performed after application of a program voltage pulse. Application of voltages to wordlines can involve applying one voltage to a selected wordline and a different voltage to the unselected wordlines to inhibit the operation for the unselected wordlines. In one such example, the voltage applied to the unselected wordlines is higher than the voltage applied to the selected wordline. In another example, the same voltage is applied to all the wordlines of a string. Application of a voltage involves application of one or more pulses. The pulses may have a variety of shapes and durations. For a typical 3D NAND die, the waveform of the applied voltages is typically controlled by microcode stored on a read only memory (ROM) on the NAND die. The applied voltages may also be adjusted based on values stored in one or more mode registers (e.g., registers 308 of FIG. 3).

At the end of the verify or read operation, the voltages applied to the wordlines are ramped down. Ramping down a voltage refers to decreasing the voltage from an initial magnitude to a lower magnitude (e.g., to 0V or another voltage magnitude lower than the initial magnitude). In one example, at the end of the program verify, two or more of the wordlines between the selected wordline and at least one end (e.g., source or drain end) of the string are ramped down one at a time. In one example, the two or more wordlines to be ramped down one at a time include wordlines neighboring or near to the selected wordline, at operation 604. A pre-defined number of wordlines that are near to or neighboring the program wordline refers to a number of successive wordlines on one or both sides of the program wordline. For example, the voltages applied to wordlines on one side of the selected wordline are ramped down sequentially one by one up to the selected wordline. After the voltages applied to those wordlines have been ramped down one at a time, the selected wordline is ramped down. Depending on implementation, after ramp down of the voltage applied to the two or more wordlines near the program wordline, all remaining wordlines on the string can be ramped down at the same time, or the one-by-one ramp-down can be continued with the wordlines on the other side of the program wordline. For example, after ramp down of the voltage applied to the two or more wordlines between the selected wordline and one end of the string, the voltage applied to two or more of remaining wordlines on the string can be ramped down one at a time and sequentially from the selected wordline towards the other end of the string.

Figure 7:
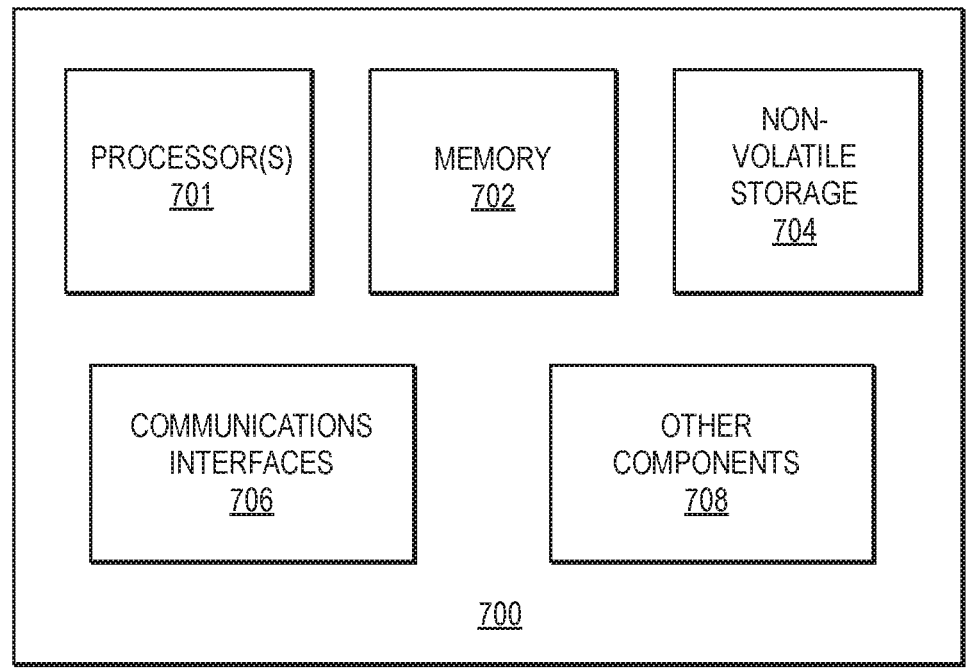
FIG. 7 provides an exemplary depiction of a computing system in which program verify recovery techniques can be implemented.

FIG. 7 provides an exemplary depiction of a computing system 700 (e.g., a smartphone, a tablet computer, a laptop computer, a desktop computer, a server computer, etc.). As observed in FIG. 7, the system 700 may include one or more processors or processing units 701. The processor(s) 701 may include one or more central processing units (CPUs), each of which may include, e.g., a plurality of general-purpose processing cores. The processor(s) 701 may also or alternatively include one or more graphics processing units (GPUs) or other processing units. The processor(s) 701 may include memory management logic (e.g., a memory controller) and I/O control logic. The processor(s) 701 can be similar to, or the same as, the processor 352 of FIG. 3.

The system 700 also includes memory 702 (e.g., system memory), non-volatile storage 704, communications interfaces 706, and other components 708, which may also be similar to, or the same as, components of the host 350 of FIG. 3. The other components may include, for example, a display (e.g., touchscreen, flat-panel), a power supply (e.g., a battery or/or other power supply), sensors, power management logic, or other components. The communications interfaces 706 may include logic and/or features to support a communication interface. For these examples, communications interface 706 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 704, which may be the mass storage component of the system. The non-volatile storage 704 can be similar to, or the same as, the memory device 300 of FIG. 3, described above. The non-volatile storage 704 can include a solid state drive (SSD), a dual in-line memory module (DIMM), or other non-volatile storage. Non-volatile storage 704 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 704 may include mass storage that is composed of one or more SSDs. SSDs can be composed of flash memory chips that are capable of implementing the array access sequences described above.

Thus, a technique for program verify is described. By ramping down the wordlines in the array in one at a time, residual free carrier population inside the array channel can be significantly reduced, leading to improvements in program disturb and threshold voltage distribution.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile storage device comprising:
a storage array including strings of memory cells;
logic to:
apply a voltage to wordlines of a string to perform a program verify;
ramp down the voltage applied to two or more of the wordlines between a selected wordline and at least one end of the string one at a time; and
a register to store a value to indicate a time delay between ramping down wordlines one at a time.

2. The non-volatile storage device of claim 1, wherein:
the at least one end of the string includes a source or drain of the string.

3. The non-volatile storage device of claim 1, wherein:
the storage array comprises a 3D NAND array;
the string comprises a 3D NAND string; and
the at least one end of the string includes a select gate source (SGS) or a select gate drain (SGD).

4. The non-volatile storage device of claim 1, wherein:
the two or more wordlines to be ramped down one at a time include wordlines neighboring the selected wordline.

5. The non-volatile storage device of claim 1, wherein the logic to ramp down the voltage is to:
ramp down the voltage applied to the two or more wordlines one at a time and sequentially in a direction from at least one end of the string to the selected wordline.

6. The non-volatile storage device of claim 1, wherein the logic is to:
after ramp down of the voltage applied to the two or more wordlines, ramp down the voltage applied to two or more of remaining wordlines on the string one at a time and sequentially from the selected wordline towards the other end of the string.

7. The non-volatile storage device of claim 1, wherein the logic is to:
after ramp down of the voltage applied to the two or more wordlines, ramp down the voltage applied to remaining wordlines on the string at the same time.

8. The non-volatile storage device of claim 1, wherein the logic to ramp down the voltage is to:
ramp down the voltage applied to the two or more wordlines one at a time and sequentially in a direction from source to drain of the string.

9. The non-volatile storage device of claim 1, wherein the logic to ramp down the voltage is to:
ramp down the voltage applied to the two or more wordlines one at a time and sequentially in a direction from drain to source of the string.

10. The non-volatile storage device of claim 1, wherein:
the non-volatile storage device comprises a solid state drive (SSD).

11. A three-dimensional (3D) NAND die comprising:
a 3D NAND array including NAND strings of memory cells;
logic to:
apply a voltage to wordlines of a string to perform a program verify;
ramp down the voltage applied to two or more of the wordlines between a selected wordline and at least one end of the string one at a time; and
a register to store a value to indicate a number of wordlines to be ramped down one at a time.

12. The 3D NAND die of claim 11, wherein:
the two or more wordlines to be ramped down one at a time include wordlines neighboring the selected wordline.

13. The 3D NAND die of claim 11, wherein:
ends of the string include a select gate source (SGS) and a select gate drain (SGD).

14. The 3D NAND die of claim 11, wherein the logic to ramp down the voltage is to:
ramp down the voltage applied to the two or more wordlines one at a time and sequentially in a direction from at least one end of the string to the selected wordline.

15. The 3D NAND die of claim 11, wherein the logic is to:
after ramp down of the voltage applied to the two or more wordlines, ramp down the voltage applied to two or more of remaining wordlines on the string one at a time and sequentially from the selected wordline towards the other end of the string.

16. The 3D NAND die of claim 11, wherein the logic is to:
after ramp down of the voltage applied to the two or more wordlines, ramp down the voltage applied to remaining wordlines on the string at the same time.

17. A system comprising:
a non-volatile storage device comprising:
a storage array including strings of memory cells;
logic to:
apply a voltage to wordlines of a string to perform a program verify; and
ramp down the voltage applied to two or more wordlines between a selected wordline and at least one end of the string one at a time; and
a register to store a value to indicate a time delay between ramping down wordlines one at a time; and
a processor coupled with the non-volatile storage device.

18. The system of claim 17, wherein:
the storage array comprises a 3D NAND array;
the string comprises a 3D NAND string; and
the at least one end of the string includes a select gate source (SGS) or a select gate drain (SGD).

19. The system of claim 17, wherein:
the two or more wordlines to be ramped down one at a time include wordlines neighboring the selected wordline.

20. The system of claim 17, wherein the logic to ramp down the voltage is to:
ramp down the voltage applied to the two or more wordlines one at a time and sequentially in a direction from at least one end of the string to the selected wordline.

* * * * *